United States Patent
Mathew et al.

(10) Patent No.: US 7,432,122 B2
(45) Date of Patent: Oct. 7, 2008

(54) ELECTRONIC DEVICE AND A PROCESS FOR FORMING THE ELECTRONIC DEVICE

(75) Inventors: Leo Mathew, Austin, TX (US); Michael G. Khazhinsky, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 238 days.

(21) Appl. No.: 11/327,686

(22) Filed: Jan. 6, 2006

(65) Prior Publication Data

US 2007/0158703 A1    Jul. 12, 2007

(51) Int. Cl.
H01L 21/00    (2006.01)
H01L 21/84    (2006.01)
H01L 21/20    (2006.01)
H01L 21/36    (2006.01)

(52) U.S. Cl. .................. 438/48; 438/149; 438/479; 438/480

(58) Field of Classification Search ................ 438/48, 438/149, 479–480
See application file for complete search history.

(56) References Cited

U.S. PATENT DOCUMENTS

| | | | |
|---|---|---|---|
| 4,859,623 A | 8/1989 | Busta | |
| 5,689,127 A | 11/1997 | Chu et al. | |
| 5,804,848 A | 9/1998 | Mukai | |
| 6,011,725 A | 1/2000 | Eitan | |
| 6,097,065 A | 8/2000 | Forbes et al. | |
| 6,150,687 A | 11/2000 | Noble et al. | |
| 6,300,182 B1 | 10/2001 | Yu | |
| 6,330,184 B1 | 12/2001 | White et al. | |
| 6,355,961 B1 | 3/2002 | Forbes | |
| 6,372,559 B1 | 4/2002 | Crowder et al. | |
| 6,396,108 B1 | 5/2002 | Krivokapic et al. | |
| 6,413,802 B1 | 7/2002 | Hu et al. | |
| 6,414,356 B1 | 7/2002 | Forbes et al. | |
| 6,424,001 B1 | 7/2002 | Forbes | |
| 6,433,609 B1 | 8/2002 | Voldman | |
| 6,458,662 B1 | 10/2002 | Yu | |
| 6,472,258 B1 | 10/2002 | Adkisson et al. | |
| 6,531,350 B2 | 3/2003 | Satoh et al. | |

(Continued)

FOREIGN PATENT DOCUMENTS

DE    101 25 967 C1    5/2001
WO    WO 00/21118    4/2000

OTHER PUBLICATIONS

Chan et al., "A True Single-Transistor Oxide-Nitride-Oxide EEPROM Device," IEEE Electronic Device Letters, Mar. 1987, pp. 93-95, vol. EDL-8, No. 3.

(Continued)

Primary Examiner—Cuong Q Nguyen

(57) ABSTRACT

An electronic device can include a gated diode, wherein the gated diode includes a junction diode structure including a junction. A first conductive member spaced apart from and adjacent to the junction can be connected to a first signal line. A second conductive member, spaced apart from and adjacent to the junction, can be both electrically connected to a second signal line and electrically insulated from the first conductive member. The junction diode structure can include a p-n or a p-i-n junction. A process for forming the electronic device is also described.

20 Claims, 8 Drawing Sheets

U.S. PATENT DOCUMENTS

| | | | |
|---|---|---|---|
| 6,566,682 | B2 | 5/2003 | Forbes |
| 6,583,469 | B1 | 6/2003 | Fried et al. |
| 6,642,115 | B1 | 11/2003 | Cohen et al. |
| 6,686,245 | B1 | 2/2004 | Mathew |
| 6,689,650 | B2 | 2/2004 | Gambino et al. |
| 6,720,216 | B2 | 4/2004 | Forbes |
| 6,768,158 | B2 | 7/2004 | Lee et al. |
| 6,800,905 | B2 | 10/2004 | Fried et al. |
| 6,846,734 | B2 | 1/2005 | Amos et al. |
| 6,903,967 | B2 | 6/2005 | Mathew |
| 2003/0151077 | A1 | 8/2003 | Mathew |
| 2003/0178670 | A1 | 9/2003 | Fried |
| 2004/0235300 | A1 | 11/2004 | Mathew |
| 2005/0077577 | A1* | 4/2005 | Manna et al. ............... 257/355 |
| 2005/0098822 | A1 | 5/2005 | Mathew |
| 2005/0124120 | A1 | 6/2005 | Du et al. |

OTHER PUBLICATIONS

Hisamoto et al., "FinFET-A Self-Aligned Double-Gate MOSFET Scalable to 20 nm," IEEE Transactions on Electron Devices, Dec. 2000, pp. 2320-2325, vo. 47, No. 12.

Lee et al., "Multilevel Vertical-Channel SONOS Nonvolatile Memory on SOI," IEEE Electron Device Letters, 2000, pp. 1-3 and 208-209.

Choi et al., "Sub-20 nm CMOS FinFET Technologies," 0-7803-7052-X/01 IEEE, 2001, 4 pps.

Fossum et al., "Extraordinarily High Drive Currents in Asymmetrical Double-Gate MOSFETs," Superlattices and Microstructures, vol. 28, No. 5/6, 2000, pp. 525-530.

Kedzierski et al., "High-Performance Symmetric-Gate and CMOS-Compatible Vt Asymmetric-Gate FinFET Devices," 0-7803-7052-X/01 IEEE, 2001, 4 pps.

Kim et al., "Double-Gate CMOS: Symmetrical-Gate Devices," IEEE Transaction on Electron Devices, vol. 48, No. 2, Feb. 2001, pp. 294-299.

Tanaka et al., "Ultrafast Operation of Vth-Adjusted P+-N+ Double-Gate SOI MOSFET's," IEEE Electron Devices Letters, vol. 15, No. 10, Oct. 1994, pp. 386-388.

Yu et al., "FinFET Scaling to 10 nm Gate Length," IEDM, 2002, pp. 251-254.

Singer et al., "Dual Gate Control Provides Threshold Voltage Options," Semiconductor International, Nov. 1, 2003, 2 pps.

Denton et al., "Fully Depleted Dual-Gated Thin-Film SOI P-MOSFET With An Isolated Buried Polysilicon Backgate," Proceedings 1995 IEEE International SOI Conference, Oct. 1995, pp. 135-136.

Tanaka et al., "Analysis of P+ Poly Si Double-Gate Thin-Film SOI MOSFETS," IEEE, 1991, pp. 26.6.1-26.6.4.

Russ et al., "ESD Evaluation of the Emerging MuGFET Technology," 2005 EOS/ESD Symposium, ESD Association.

U.S. Appl. No. 11/130,873 entitled "Integrated Circuit with Multiple Independent Gate Field Effect Transistor (MIGFET) Rail Clamp Circuit," filed May 17, 2005.

U.S. Appl. No. 10/909,095 entitled "Method of Making a Double Gate Semiconductor Device with Self-Aligned Gates and Structure Thereof," filed Jul. 30, 2004.

* cited by examiner

ELECTRONIC DEVICE AND A PROCESS FOR FORMING THE ELECTRONIC DEVICE

BACKGROUND

1. Field of the Disclosure

The present disclosure relates to electronic devices, more particularly, to gated diode structures and processes for forming them.

2. Description of the Related Art

A diode structure is among the simplest of electronic components and can be used in many applications. A diode structure may or may not be gated. When gated, a single signal line can be used to control one or more gate electrodes of the diode structure. Having no gate electrode or having just a single signal line for the gate electrode(s) may result in insufficient control over a junction within the diode structure when operated under different conditions.

BRIEF DESCRIPTION OF THE DRAWINGS

The present disclosure may be better understood, and its features and benefits made apparent to those skilled in the art by referencing the accompanying drawings. The subject of the disclosure is illustrated by way of example and not limitation in the accompanying figures.

Figure 1:
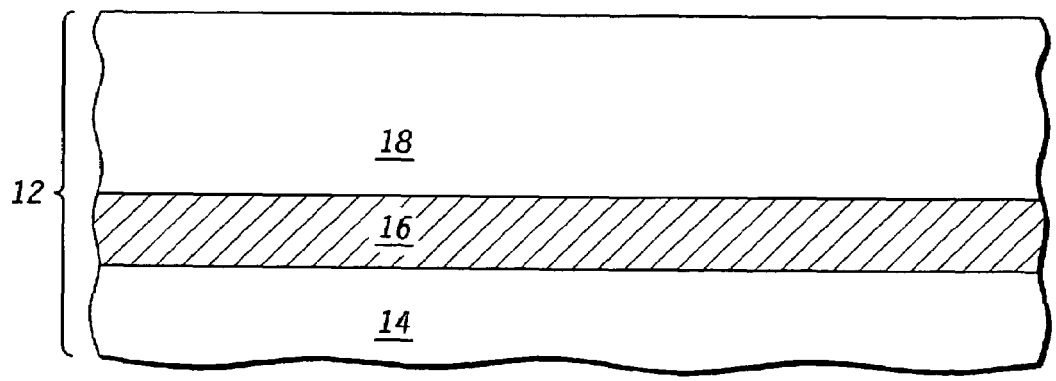
FIG. 1 includes an illustration of a cross-sectional view of a portion of a substrate 12 at a location of workpiece 10 where a junction can be formed.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention. The use of the same reference symbols in different drawings indicates similar or identical items.

DETAILED DESCRIPTION

An electronic device can include a gated diode that can be formed and have more than one independently controlled gate electrode to allow for more control options of the gated diode. In a particular embodiment, the gated diode can have substantially uniform current flow across the entire cross-section of the structure. In a particular embodiment, the gated diode can have improved current carrying capability, lower parasitic capacitive coupling than a conventional gated diode, or any combination thereof. Particular, non-limiting embodiments will be better understood with reference to FIGS. 1 through 19.

Some terms are defined or clarified as to their intended meaning as they are used within this specification. As used herein the term "lightly doped" is intended to mean in a range of approximately 1 E15 to approximately 1 E18 atoms per $cm^3$. Also the term "heavily doped" is intended to mean a dopant concentration in a range of approximately 1 E19 to approximately 1 E22 atoms per $cm^3$.

A p-i-n diode is intended to mean a diode that includes an intrinsic region that separates an n-doped region and a p-doped region.

As used herein, the term "intrinsic," when used to describe a semiconductor material, is intended to mean a semiconductor material that is undoped or has a doping concentration of no greater than 1 E15 atoms per $cm^3$.

As used herein, the term "planar," with respect to an electronic component, is intended to mean that such electronic component is designed such that, when such electronic component is operating, charge carriers principally flow through a junction within the electronic component in a direction substantially parallel to a major surface of the substrate.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the semiconductor and microelectronic arts. Other features and advantages of the invention will be apparent from the following detailed description, and from the claims.

Note that not all of the activities described in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining which one or more activities or one or more portions thereof are used or not used and the order of such activities are to be performed for their specific needs or desires.

FIG. 1 includes an illustration of a cross-sectional view of a portion of a substrate 12 at a location of workpiece 10 where a junction can be formed. In the illustrated embodiment, substrate 12 includes a semiconductor-on-insulator ("SOI") substrate that includes layers 14, 16, and 18. Layer 14 can be a support layer and provide mechanical support for the other layers of the substrate. Layer 16 can be an insulating layer and provide electrical insulation between layer 14 and layer 18. Layer 18 can be a semiconductor layer and can include a semiconductor element, such as silicon, germanium, carbon or any combination thereof and has a substantially uniform thickness in a range of approximately 50 to approximately 150 nm. Layer 18 can have an n-type doped (phosphorus-containing, arsenic-containing, antimony-containing, or any combination thereof) portion, a p-type doped (boron-containing) portion, an undoped portion, or any combination thereof. Dopant concentration for a doped portion can vary widely from lightly doped (e.g., approximately 1 E15 atoms per $cm^3$) to heavily doped (e.g., approximately 1 E22 atoms per $cm^3$) depending on the desired characteristics of the junction. In a particular embodiment, layer 18 can be n-type doped with phosphorus, arsenic, or antimony at a dopant concentration of approximately 1 E18 atoms per $cm^3$.

In a particular embodiment, substrate 12 is illustrated as an SOI substrate. In other embodiments, other materials could be substituted for layer 14, layer 16, or any combination thereof, such as a monocrystalline semiconductor wafer, quartz plate, or other substrate conventionally used for electronic devices.

Figure 2:
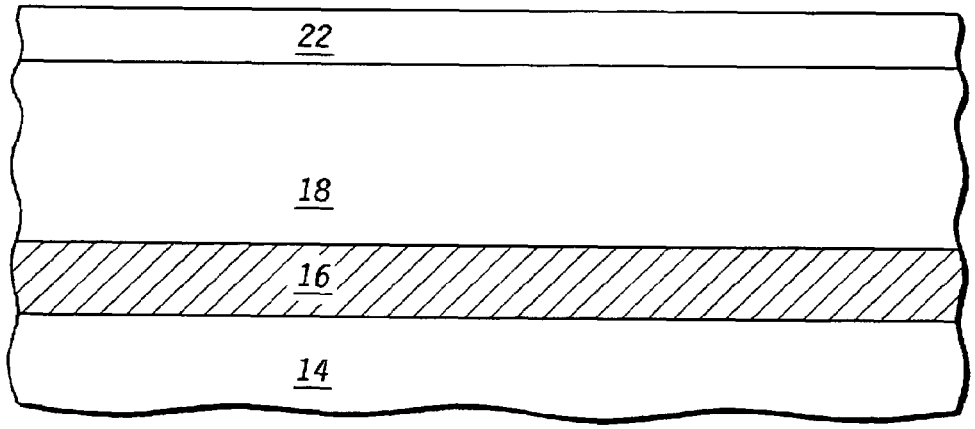
FIG. 2 includes an illustration of a cross-sectional view of workpiece 10 of FIG. 1 after formation of a layer that can form a hard mask.

FIG. 2 includes an illustration of a cross-sectional view of workpiece 10 of FIG. 1 after formation of layer 22. Layer 22 can be used to form a hard mask to protect a portion of layer 18 from one or more subsequent etch processes. In one embodiment, the material of layer 22 is selected such that an etch process designed to remove exposed portions of layer 18 will not remove exposed portions of layer 22, or would do so at a significantly slower rate. Layer 22 can comprise an oxide, a nitride, an oxynitride, lithographic resist material, another material resistant to an etch process when removing layer 18, or any combination thereof. Layer 22 can have a thickness in a range of approximately 10 nm to approximately 1000 nm and be grown or deposited by a conventional or proprietary process. In one embodiment, layer 22 can include a plurality of layers.

Figure 3:
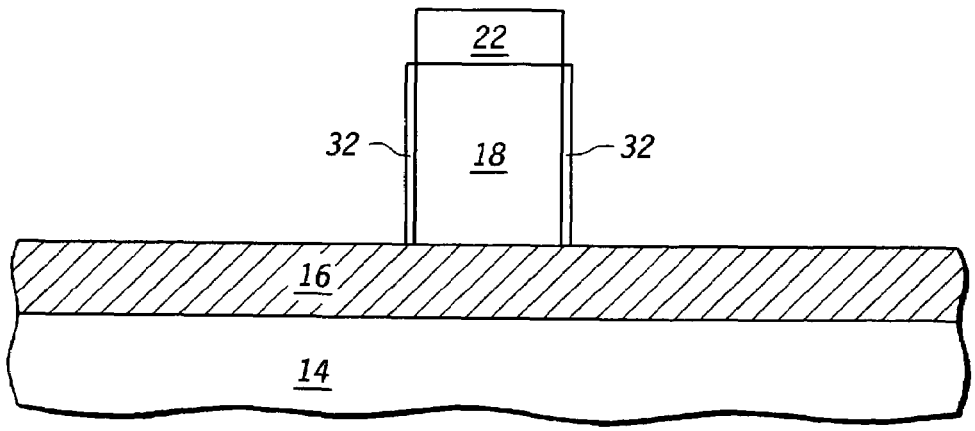
FIG. 3 includes an illustration of a cross-sectional view of workpiece 10 of FIG. 2 after formation of a fin structure.

FIG. 3 includes an illustration of a cross-sectional view of workpiece 10 of FIG. 2 after removing a portion of layer 18, using a portion of layer 22 as a hard mask. In the illustrated embodiment, the hard mask is formed from layer 22 by patterning using a conventional or proprietary lithographic technique. In one embodiment (not illustrated), a patterned resist layer is formed over layer 22 such that a portion of layer 22 remains exposed. The exposed portion of layer 22 can be removed, exposing a portion of layer 18. The patterned resist layer can be removed from the workpiece 10. The exposed portion of layer 18 can be removed to expose a portion of underlying layer 16. A portion of layer 18 underlying a remaining portion of layer 22 can form a semiconductor fin. Optionally, an active semiconductor region within layer 18 can be doped to previously described levels after formation of the semiconductor fins.

Also with respect to FIG. 3, in the illustrated embodiment, layer 32 can be formed. Layer 32 can comprise a dielectric layer, a portion of which can serve as a gate dielectric for a diode structure being formed at this location. Layer 32 can include a film of silicon dioxide, silicon nitride, silicon oxynitride, a high dielectric constant ("high-k") material (e.g., dielectric constant greater than 8), or any combination thereof. The high-k material can include $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing or Zr-containing dielectric material, a doped version of any of the foregoing (lanthanum doped, niobium doped, aluminum doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Layer 32 may be thermally grown using an oxidizing or nitridizing ambient, or deposited using a conventional or proprietary chemical vapor deposition ("CVD") technique, physical vapor deposition ("PVD") technique, or a combination thereof. Layer 32 can have a thickness in a range of approximately 1 to approximately 25 nm.

Figure 4:
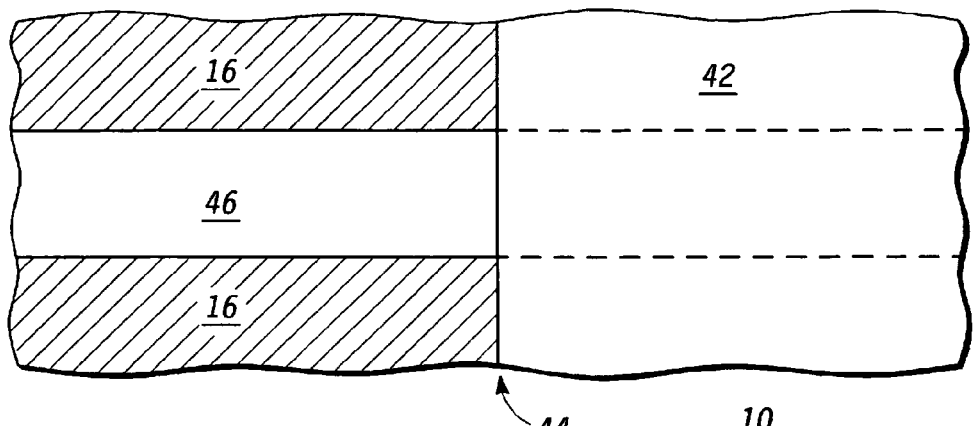
FIG. 4 includes an illustration of a top view of the workpiece 10 of FIG. 3 after formation of a cathode implant mask.

FIG. 4 includes an illustration of a top view of the workpiece 10 of FIG. 3 after formation of a patterned resist layer 42. Here and elsewhere in this specification some of the dielectric layers, such as layer 22, have not been illustrated to better illustrate the relative positions of underlying features. Patterned resist layer 42 can include a sacrificial layer to prevent doping of an underlying portion of layer 18. Patterned resist layer 42 can have an edge along a line at location 44 that bisects a fin structure. In the illustrated embodiment, the line at location 44 can be substantially perpendicular to the length of the fin structure. In another embodiment, a different angle could be used. Patterned layer 42 can be formed by conventional or proprietary lithographic process.

A dopant can be introduced to an exposed portion of layer 18 to form portion 46. In one embodiment, portion 46 can be n-type doped and serve as a cathode for a junction of a junction diode. Unexposed portions of layer 18 substantially remain at their previous doping level. The doping level of portion 46 can vary widely, from lightly to heavily doped concentrations depending on the junction to be formed. In one embodiment, the dopant can be introduced by ion implantation. In another embodiment, the dopant can be introduced by furnace doping and thermal diffusion. In a particular embodiment, layer 18 can be heavily doped. In other embodiments layer 18 can be lightly doped. Patterned resist layer 42 can be removed by conventional or proprietary process. In a particular embodiment, layer 18 can be formed of n-type semiconductor material with the desired doping level to form portion 46 such that formation of layer 42 and the subsequent cathode doping process may not be required.

Figure 5:
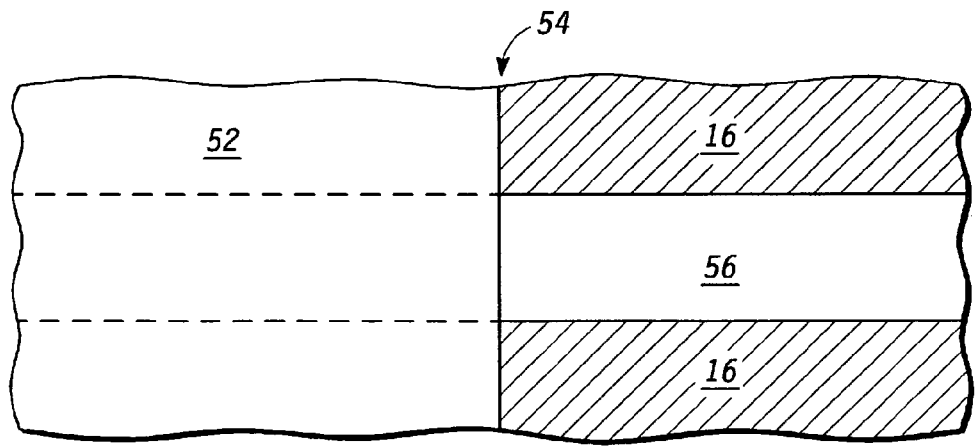
FIG. 5 includes an illustration of a top view of the workpiece 10 of FIG. 4 after formation of an anode implant mask.

FIG. 5 includes an illustration of a top view of the workpiece 10 of FIG. 4 after formation of a patterned resist layer 52. Patterned resist layer 52 is a sacrificial layer to prevent doping of an underlying portion of layer 18. From the top view, patterned resist layer 52 can have an edge along a line at location 54 that bisects a fin structure. In the illustrated embodiment, the line at location 54 can be substantially perpendicular to the length of the fin structure. In another embodiment, a different angle could be used. Patterned layer 52 can be formed by conventional or proprietary lithographic process.

A dopant of a conductive type opposite that of portion 46 can be introduced to an exposed portion of layer 18 to form doped portion 56. In one embodiment, portion 56 can be p-type doped and serve as an anode for a junction of a junction diode structure. Unexposed portions of layer 18 substantially remain at their previous doping level. Although of opposite conductive type, the dopant in portion 56 can have a concentration in a range similar to that described for portion 46 and can be introduced by similar techniques. The concentration and introduction process can be the same or different for portions 46 and 56. Further, the dopant concentrations in portions 46 and 56 may be the same or different form each other. Patterned resist layer 52 can be removed by conventional or proprietary process. In a particular embodiment, layer 18 can be formed of p-type semiconductor material with the desired doping level to form portion 56 such that formation of layer 52 and the subsequent anode doping process, described above, may not be required.

Figure 6:
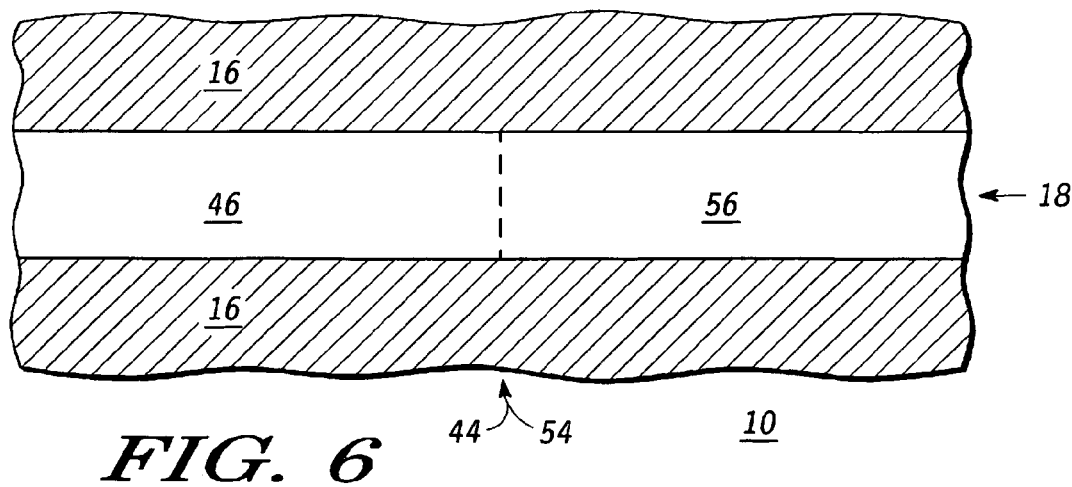
FIG. 6 includes an illustration of a top view of the workpiece 10 of FIG. 5 wherein a p-n junction is formed in accordance with a particular embodiment.

FIG. 6 includes an illustration of the workpiece of FIG. 5 after formation of a p-n junction. In one embodiment, the line at location 44 and the line at location 54 can be substantially co-located such that a p-n junction can be formed as illustrated in FIG. 6. In other embodiments, other junctions may be formed. In a particular embodiment, described elsewhere in this specification, a p-i-n junction can be formed.

Figure 7:
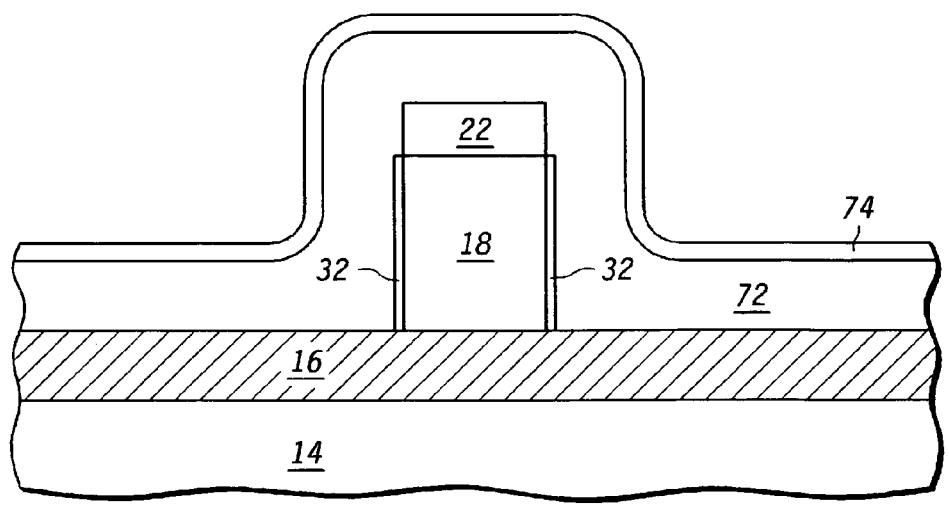
FIG. 7 includes an illustration of a cross-sectional view of the workpiece 10 of FIG. 6 after formation of a conductive layer and a hardmask layer.

FIG. 7 includes an illustration of a cross-sectional view of the workpiece 10 of either FIG. 6, after formation of layers 72 and 74. Layer 72 can comprise a conductive material suitable for use as a gate electrode. Layer 74 can be used to form a hard mask to protect portions of layer 72 during subsequent processing. Layers 72 and 74 can be selectively removed with respect to each other by a conventional or proprietary process.

Layer 72 can comprise one or more semiconductor-containing or metal-containing materials. In one embodiment, layer 72 comprises polysilicon or amorphous silicon deposited by a chemical vapor deposition process. In another embodiment, layer 72 may comprise one or more other materials or may be deposited by another process. Layer 72 can be doped when deposited, or doped after it is deposited. In one embodiment, the thickness of layer 72 is in a range of approximately 50 to approximately 500 nm, and in a finished device, remaining portions of the conductive layer have a dopant concentration of at least approximately 1 E19 atoms/cm$^3$ when the conductive layer comprises polysilicon or amorphous silicon. Layer 72 may comprise a plurality of layers. A metallic element in the metal-containing material of layer 72 can be a transition metal element and may include tantalum, titanium, molybdenum, ruthenium rhenium, palladium, osmium, iridium, platinum, the like, or any combination thereof. The metal-containing material can be an oxide, a nitride, an oxynitride, or any combination thereof. The metal-containing material may or may not include silicon. In an alternative embodiment the metal containing material is an elemental metal.

Layer 74 can be formed by an embodiment previously described for forming layer 22. Layer 74 can comprise a material such as those described for layer 22. Layer 22 and layer 74 may comprise different materials and have different thicknesses. In another embodiment, layer 74 can be between approximately 5 and 50 nm in thickness.

Figure 8:
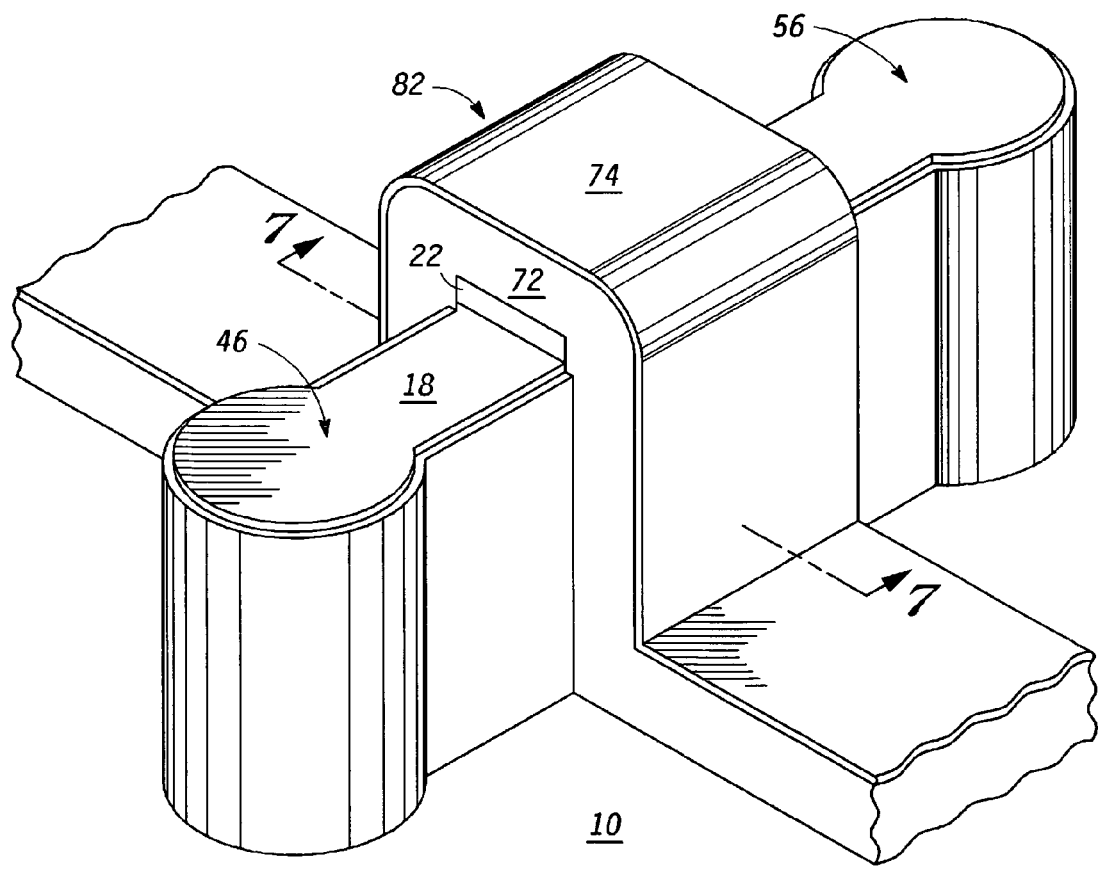
FIG. 8 includes an illustration of a perspective view of the workpiece 10 of FIG. 7 after formation of a gate electrode structure overlying a junction and removal of portions of overlying protective layers from anode and cathode regions of the electronic device.

FIG. 8 includes an illustration of a perspective view of the workpiece 10 of FIG. 7 after formation of conductive member 82 and removal of exposed portions of layer 22. A patterned resist layer (not illustrated) is formed over the workpiece 10 by conventional or proprietary process. Exposed portions of layer 74, 72, and 22 are removed by a conventional or proprietary process. The patterned resist layer can be removed from the workpiece 10 by a conventional or proprietary technique. In one embodiment, (not illustrated) a layer can be formed over exposed portions of layer 18 to help reduce implant channeling.

In another embodiment, additional dopant can be introduced to a portion of layer 18 and driven into the junction region to help form a cathode portion, an anode portion, a junction portion, or any combination thereof, of the junction diode structure. Conductive member 82 can be formed overlying the junction of the junction diode structure. In another embodiment, another type of diode junctions can underlie conductive member 82, such as a p-i-n junction. Conductive member 82 can serve as a mask to help block additional dopants from entering a portion of layer 18 during subsequent processing.

Figure 9:
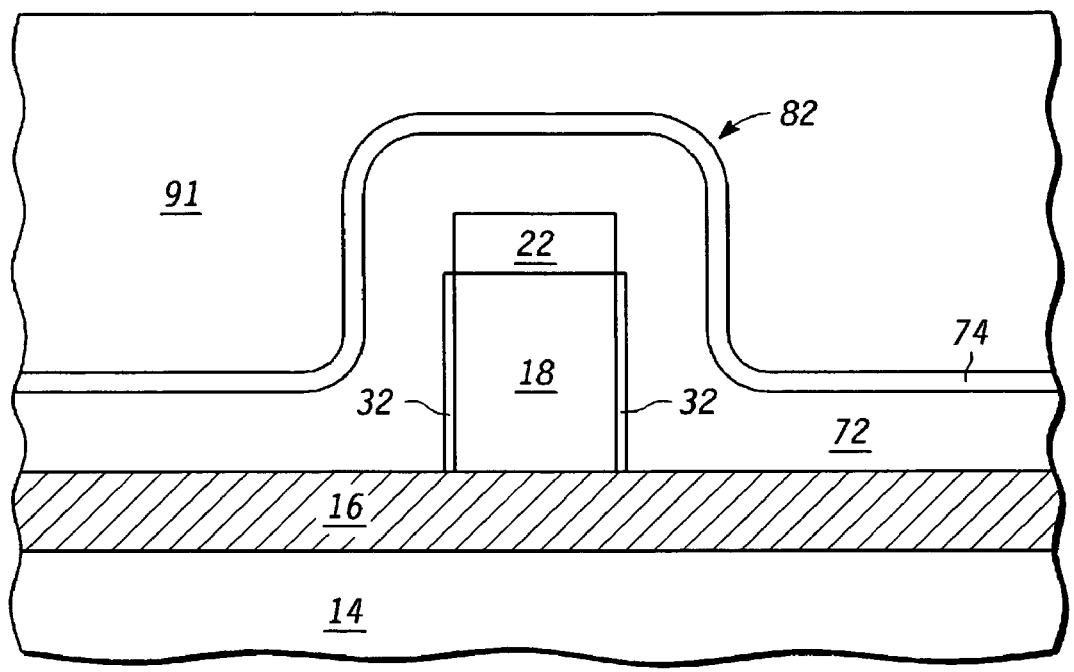
FIG. 9 includes an illustration of a cross-sectional view of the workpiece 10 of FIG. 8 after formation of a sacrificial layer.

FIG. 9 includes a cross-sectional view of the workpiece 10 of FIG. 8 after formation of layer 91. In one embodiment, layer 91 can be a relatively thick sacrificial layer that can provide some planarization for the workpiece 10, such that the magnitude of the undulation of the top surface of layer 91 is not as great as the magnitude of the undulations of the top surface of layer 74. The material of layer 91 and layer 74 should be selectively removable with respect to each other under different conditions. In one embodiment, layer 91 can be a resist-like organic material, an oxide, a nitride, an oxynitride, or any combination thereof.

Figure 10:
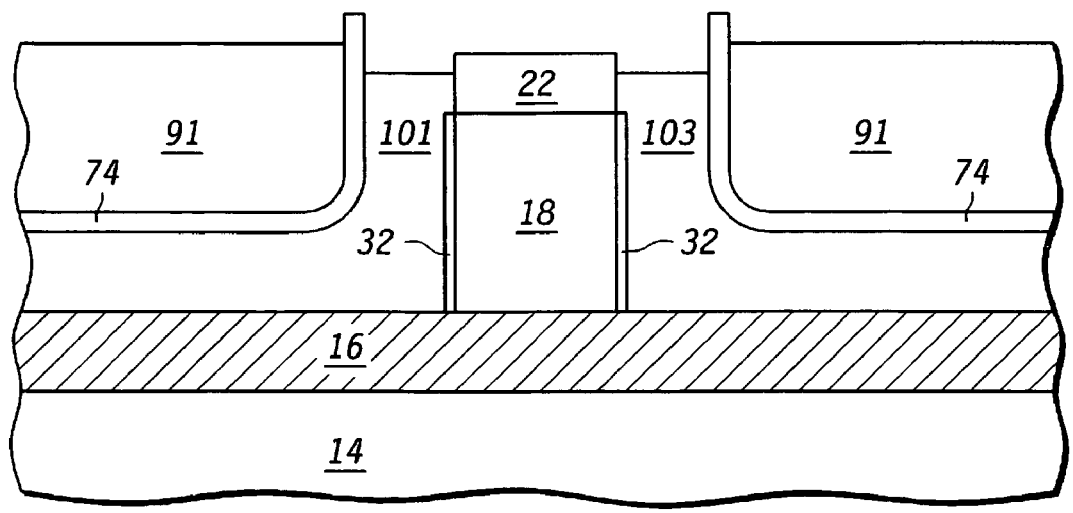
FIG. 10 includes an illustration of a cross-sectional view of the workpiece 10 of FIG. 9 after separation of the conductive layer into separate conductive members.

FIG. 10 includes an illustration of a cross-sectional view of the workpiece 10 of FIG. 9 after separation of conductive member 82 into conductive members 101 and 103. Conductive members 101 and 103 can each serve as a gate electrode for a gated diode. A portion of layer 91 can be removed to expose a portion of layer 74 overlying the diode junction. In one embodiment, such a removal process for portions of layer 91 can include a blanket etch process selective to layer 74. In another embodiment layer 91 can be patterned using a lithographic process. The exposed portion of layer 74 is removed to expose a remaining portion of layer 72. The exposed portion of layer 72 can be removed to expose a remaining portion of layer 22, substantially separating a remaining portion of layer 72 into conductive members 101 and 103. In the illustrated embodiment, a process for removing a portion of layer 72 can include a removal process selective to layer 91, layer 74, and layer 22. Such a process can endpoint on an exposed portion of layer 22 such that at least a portion of layer 22 lies below the top surface of the remaining portions of layer 72 after forming conductive members 101 and 103. Each layer removal can be performed utilizing a conventional or proprietary process.

Figure 11:
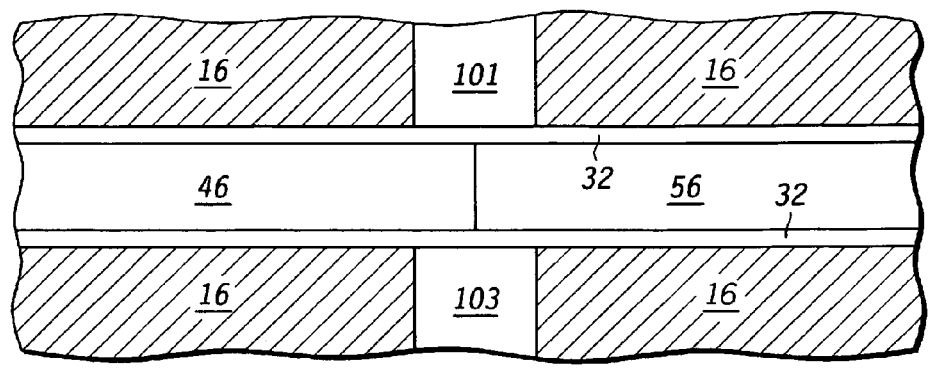
FIG. 11 includes an illustration of a top-view of the workpiece 10 of FIG. 10, where in another embodiment, a p-n junction is formed.

FIG. 11 includes an illustration of a top view of the work piece 10 of FIG. 10 with layers 22, 74, and 91 omitted from the illustration for clarity. Conductive members 101 and 103 are adjacent to and spaced apart from a junction of a junction diode structure. Conductive members 101 and 103 are separated from each other and can each serve as a different gate electrode for a gated diode. A first portion of layer 32 can lie between conductive member 101 and the junction of the junction diode structure and serve as a first gate dielectric layer, and a second portion of layer 32 can lie between conductive member 103 and the junction of the junction diode structure and serve as a second gate dielectric layer.

Figure 12:
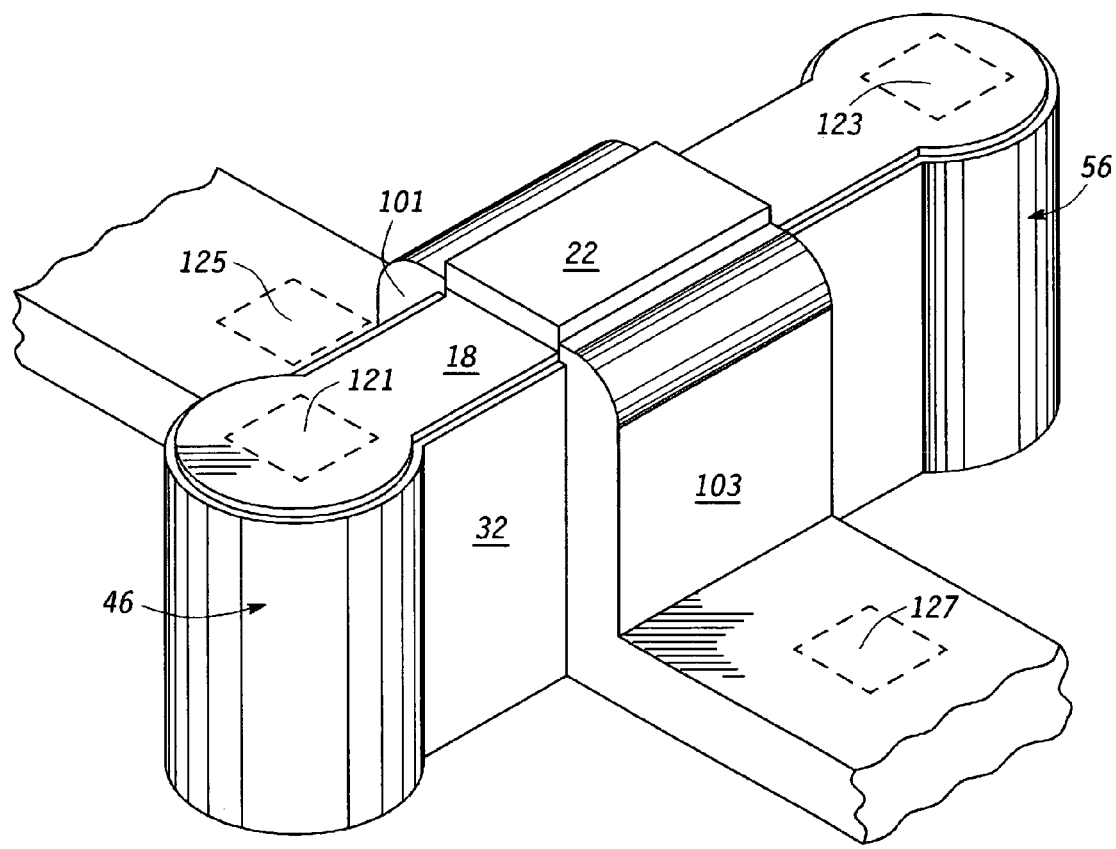
FIG. 12 includes an illustration of a perspective view of the workpiece 10 of FIG. 11 indicating locations where electrical connections can be made.

FIG. 12 includes an illustration of a perspective view of the workpiece 10 of FIG. 11 after removal of a remaining portion of layer 91 and layer 74. Contact regions 121, 123, 125, and 127 can be formed. Contact region 121 can serve as a contact for a cathode of a junction diode structure. Contact region 123 can serve as a contact for an anode of the junction diode structure. Contact regions 125 and 127 can each serve as a connection to a signal line for conductive members 101 and 103, respectively. In some embodiments, an additional implant can be performed to raise the dopant concentration to not less than 1 E19 atoms per cm$^3$ at a contact region.

Figure 13:
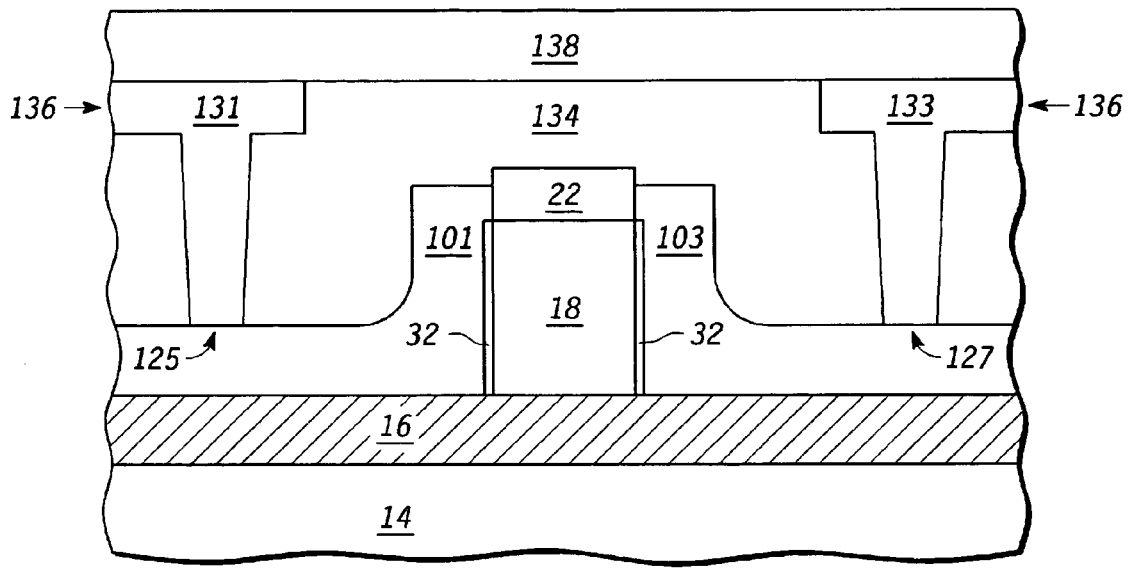
FIG. 13 includes an illustration of a cross-sectional view of a substantially completed electronic device.

FIG. 13 includes an illustration of a cross-sectional view of a substantially completed electronic device including a gated diode. One or more insulating layers 134, one or more conductive layers 136, and one or more encapsulating layers 138 are formed using one or more conventional or proprietary techniques. In the illustrated embodiment, conducting layers 136 can form signal lines 131 and 133, which can allow conductive members 101 and 103 to be independently controlled.

Figure 14:
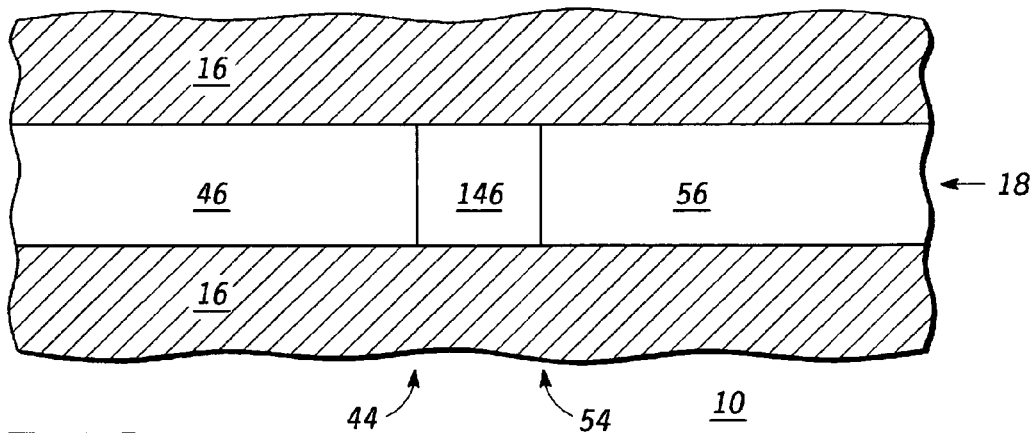
FIG. 14 includes an illustration of a top view of the workpiece 10 of FIG. 5 wherein a p-i-n junction is formed in accordance with an alternative embodiment.

In an alternative embodiment, an electronic device including a gated diode can be formed wherein the gated diode further includes a p-i-n junction diode structure. The process can proceed as described for FIGS. 1 through 5. FIG. 14 includes an illustration of a top view of the workpiece of FIG. 5 when the line at location 44 and the line at location 54 can be spaced apart from each other by a portion 146 of layer 18. Portion 146 can be formed by protecting a portion of layer 18 during the anode and cathode doping process with a portion of patterned resist layer 42 and 52, respectively. In another embodiment, the doping in portion 146 can be graded, such that a graded junction can be formed. In a particular embodiment, the layer may be ion implanted with an n-type or p-type dopant at a dose no greater than 1 E13 ions per cm$^2$. Portions 46 and 56 may or may not be exposed during the ion implantation. If exposed, the dopant concentrations within portions 46 and 56 may be substantially higher than the dopant concentration within portion 146, and thus, not significantly affected even if portions 46 and 56 are implanted. The combination of the lower dopant concentration within portion 146 and the higher dopant concentration within another portion of the same conductivity type (portion 46 or 56) can form a graded junction. Portion 146 can be undoped, or n-type or p-type doped at a concentration no greater than approximately 1 E15 atoms per cm$^3$.

Figure 15:
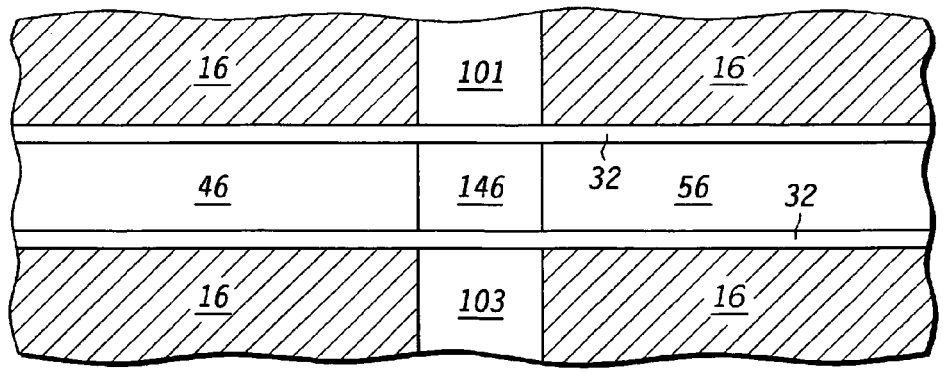
FIG. 15 includes an illustration of a top view of the workpiece 10 of FIG. 14 wherein a p-i-n junction is formed in accordance with a particular embodiment.

The process can proceed as previously described for FIGS. 7 through 10. FIG. 15 includes an illustration of a top view of the workpiece 10 of FIG. 10 with some layers omitted for clarity. The discussion of FIG. 15 parallels the discussion of FIG. 11, except the junction diode structure of the gated diode is now a p-i-n junction diode structure. Conductive member 82 can be separated into conductive members 101 and 103 as previously described. In other embodiments, other junction diode structure types can be used similarly to form other electronic devices.

Figure 16:
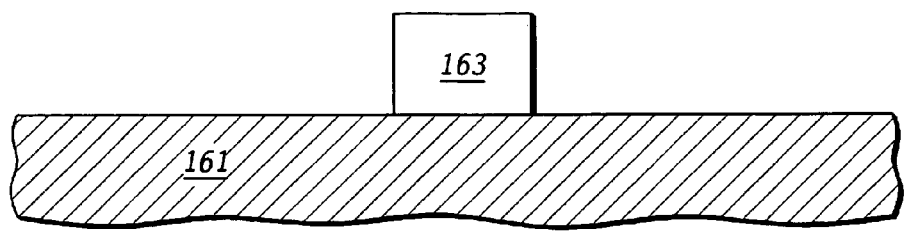
FIGS. 16 through 19 include illustrations of the workpiece 160 where a planar gated diode is formed by an alternative embodiment.

In another alternative embodiment, a planar junction diode structure can be formed with more than one conductive member that can act as a gate electrode for the junction diode structure. FIG. 16 includes an illustration of a cross-sectional view of a workpiece 160 with a conductive member 163 formed overlying a layer 161. Layer 161 can be an insulating layer and provide electrical insulation between conductive member 163 and a substrate (not illustrated). Conductive member 163 can serve as a gate electrode. Conductive member 163 can be formed of a material previously described for conductive member 101 of workpiece 10 using a conventional or proprietary lithographic process. Layer 163 can have a thickness in a range of approximately 5 to approximately 50 nm. In one embodiment, conductive member 163 can be n-type doped to a concentration of approximately 1 E19 to approximately 1 E21 atoms per cm$^3$ FIG. 17 includes an illustration of a cross-sectional view of the workpiece 160 of FIG. 16 after formation of a junction overlying conductive member 163. Layer 171 can be an insulating layer and can be formed of a material and in a manner previously described for layer 22. Layer 171 can have a thickness in a range of approximately 5 to approximately 50 nm. A portion of layer 171 can be removed to expose a portion of conductive member 163. In one embodiment, layer 171 can be lithographically patterned and etched. In another embodiment, a polishing process can be used to remove the portion of 171 overlying conductive member 163. Layer 173 can serve as a gate dielectric layer. Layer 173 can be formed of a material and by a method previously described for the formation of layer 32. Layer 173 can have a thickness similar to that described for layer 32. Layer 175 can be formed overlying layer 173. Layer 175 can be formed of a semiconductor material previously described for layer 18. Layer 175 can be deposited or grown. Layer 175 can have a thickness in a range of approximately 10 to approximately 100 nm.

Layer 175 can be lithographically patterned (not illustrated) portion can be removed to form an active region overlying conductive member 163. Portion 177 of the active region can be formed by a process similar to that described for formation of portion 46 of workpiece 10. Portion 177 can have a dopant concentration and type similar to that described for portion 46. Portion 179 of the active region can be formed by a process similar to that described for formation of portion 56 of workpiece 10. Portion 179 can have a dopant concentration and type similar to that described for portion 56. Conductive member 163 can be adjacent to and spaced apart from the junction between portions 177 and 179. A portion of layer 173 can lie between conductive member 163 and the junction.

Figure 17:
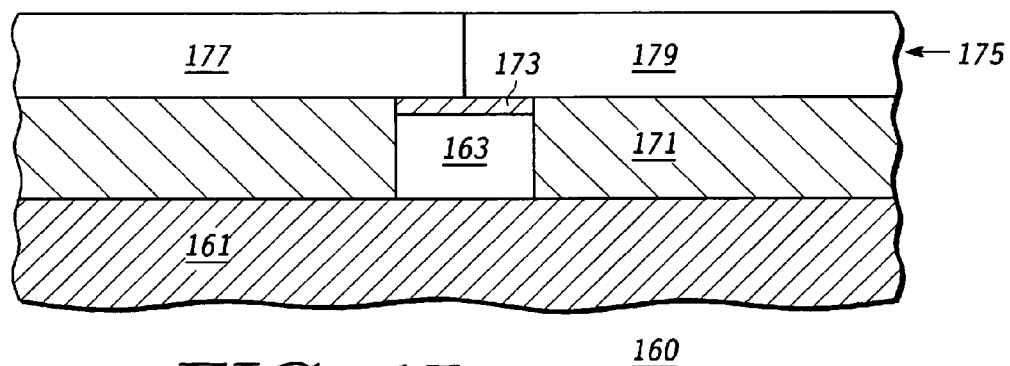
Figure 18:
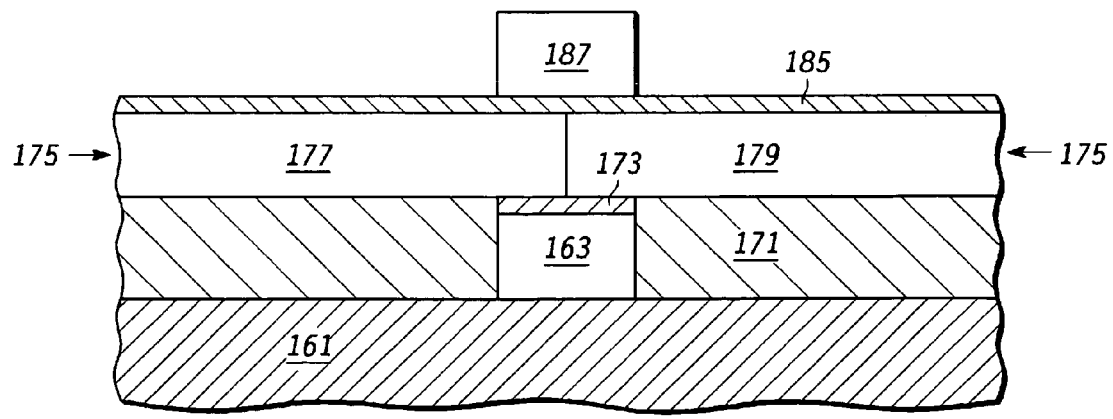

FIG. 18 includes an illustration of a cross-sectional view of the workpiece 160 of FIG. 17 after formation of conductive member 187 overlying both a junction, formed between portions 177 and 179 and conductive member 163. Layer 185 can be formed over the workpiece 160. Layer 185 can serve as a gate dielectric layer. Layer 185 can be formed of a material and by a method previously described for the formation of layer 32. Layer 185 can have a thickness similar to that described for layer 32. Layer 185 may be the same or different material and be formed by the same or different process as conductive member 163. Conductive member 187 can be adjacent to and spaced apart from the junction between portions 177 and 179. In other embodiments, other junction types may be used as previously described. Such a junction type can be a graded junction, a p-i-n junction, another diode junction type known in the art, or the like. A portion of layer 185 can lie between conductive member 187 and the junction.

Figure 19:
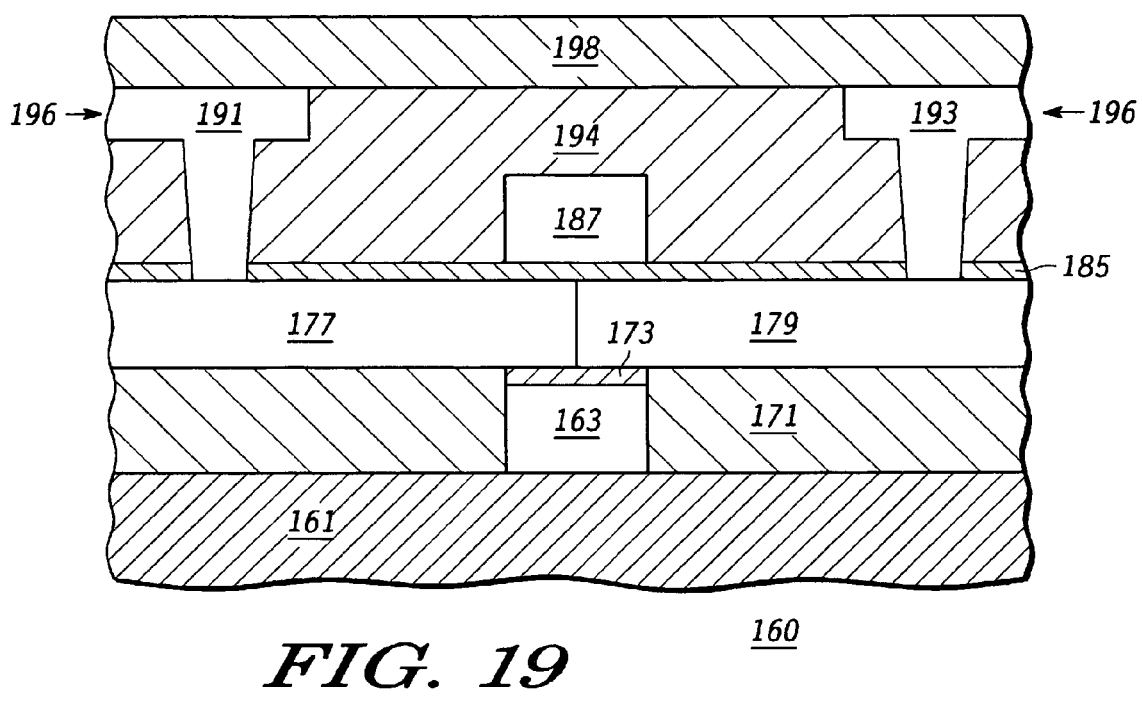

FIG. 19 includes an illustration of a cross-sectional view of a substantially completed electronic device including a gated diode. One or more insulating layers 194, one or more conductive layers 196 that form signal lines 191 and 193, and one or more encapsulating layers 198 are formed using one or more conventional or proprietary techniques. Although not illustrated, different signal lines can be connected to conductive members 163 and 187 to allow for independent control of the gate electrodes for the gated diode.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a gated diode, wherein the gated diode includes a junction diode structure including a junction, a first conductive member spaced apart from and adjacent to the junction, and a first signal line electrically connected to the first conductive member. The gated diode can also include a second conductive member spaced apart from and adjacent to the junction, and a second signal line electrically connected to the second conductive member. The first conductive member is electrically insulated from the second conductive member.

In an embodiment of the first aspect, the junction includes a graded junction. In another embodiment, the junction diode structure includes a p-i-n diode. In still another embodiment, the first conductive member, the second conductive member, or both includes a semiconductor material. In yet another embodiment, the first conductive member, the second conductive member, or both includes a metal-containing material. In another embodiment, each of the first conductive member and the second conductive member includes a gate electrode.

In another embodiment of the first aspect, the second signal line is configured to be controlled independent of the first signal line. In still another embodiment of the first aspect, the junction diode structure includes a planar diode. In yet another embodiment, the junction diode structure includes a fin diode. In another embodiment, the junction diode structure further includes a semiconductor material.

In yet another embodiment of the first aspect, the electronic device can further include a first gate dielectric layer lying between the first conductive member and the junction, and a second gate dielectric layer lying between the second conductive member and the junction.

In a second aspect, a process of forming a electronic device including a gated diode, wherein the process includes forming a junction within a semiconductor material, and forming a first conductive member spaced apart from and adjacent to the junction. The process can further include forming a second conductive member spaced apart from and adjacent to the junction, wherein the second conductive member is electrically insulated from the first conductive member, and the gated diode includes the junction, the first conductive member, and the second conductive member.

In an embodiment of the second aspect, forming the junction is performed before forming the first conductive member, before performing the second conductive member, or any combination thereof. In another embodiment, forming the junction diode structure includes forming a p-i-n diode. In still another embodiment, the process can further include forming a first signal line electrically connected to the first conductive member, and forming a second signal line electrically connected to the second conductive member. In a further embodiment, the first signal line is configured to be controlled independently from the second signal line.

In another embodiment of the second aspect, the process can further include forming a first gate dielectric between the first conductive member and the junction, and forming a second gate dielectric between the second conductive member and the junction. In yet another embodiment, forming the junction within the semiconductor material further includes forming a semiconductor fin.

In a third aspect, an electronic device can include a gated diode wherein the gated diode includes a junction diode structure including a junction, the junction including a semiconductor fin, a first conductive member spaced apart from and adjacent to the junction. The gated diode can also include a first gate dielectric lying between the first conductive member and the junction, and a first signal line electrically connected to the first conductive member. The gated diode can further include a second conductive member spaced apart from and adjacent to the junction, and a second gate dielectric lying between the second conductive member and the junction. The electronic device can also include a second signal line electrically connected to the second conductive member, and the first conductive member is electrically insulated from the second conductive member.

In an embodiment of the third aspect, the second signal line is configured to be controlled independent of the first signal line.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any sub-combination. Further, reference to values stated in ranges include each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A process of forming a electronic device comprising a gated diode, wherein the process comprises:
    forming a junction within a semiconductor material;
    forming a first conductive member, wherein after forming the junction and forming the first conductive member, the first conductive member is spaced apart from and adjacent to the junction, wherein the first conductive member includes a first gate electrode of the gated diode; and
    forming a second conductive member spaced apart from and adjacent to the junction, wherein:
        the second conductive member is electrically insulated from the first conductive member;
        the second conductive member includes a second gate electrode of the gated diode;
        forming the second conductive member is performed after forming the junction; and
        the gated diode comprises the junction, the first gate electrode, and the second gate electrode.

2. The process of claim 1, wherein forming the junction is performed before forming the first conductive member, before performing the second conductive member, or any combination thereof.

3. The process of claim 1, wherein forming the junction comprises forming a p-i-n diode.

4. The process of claim 1, further comprising:
forming a first signal line electrically connected to the first conductive member; and
forming a second signal line electrically connected to the second conductive member.

5. The process of claim 4, wherein the first signal line is configured to be controlled independently from the second signal line.

6. The process of claim 1, further comprising:
forming a first gate dielectric between the first conductive member and the junction; and
forming a second gate dielectric between the second conductive member and the junction.

7. The process of claim 1, wherein forming the junction within the semiconductor material further comprises forming a semiconductor fin.

8. The process of claim 1, wherein forming the junction comprises forming a graded junction.

9. The process of claim 1, wherein forming the junction comprises forming a pn junction.

10. The process of claim 9, wherein forming the junction is performed such that a junction diode structure of the gated diode has a single pn junction.

11. The process of claim 1, wherein forming the junction comprises forming a junction between an intrinsic semiconductor material and a doped semiconductor material.

12. The process of claim 1, wherein forming the junction, forming the first conductive member, and forming the second conductive member is performed such that the first gate electrode and the second gate electrode lie along opposite sides of a junction diode structure that includes the junction.

13. The process of claim 3, wherein forming the junction is performed such that a junction diode structure of the gated diode has a single p-type region, a single intrinsic region, and a single n-type region.

14. The process of claim 1, wherein forming the first conductive member, forming the second conductive member, or both comprises depositing the semiconductor material over the junction.

15. The process of claim 1, wherein forming the first conductive member, forming the second conductive member, or both comprises depositing a metal-containing material over the junction.

16. The process of claim 1, wherein forming the first conductive member is performed after forming the junction.

17. The process of claim 16, further comprising forming a gate dielectric layer after forming the first conductive member and before forming the junction.

18. The process of claim 1, further comprising forming a gate dielectric layer after forming the junction, wherein after forming the first conductive member and forming the second conductive member, different parts of the gate dielectric layer lie between the junction and each of the first and second gate electrodes.

19. The process of claim 1, wherein forming the junction is performed such that a junction diode structure of the gated diode comprises a fin diode including the junction.

20. The process of claim 1, further comprising:
forming a first gate dielectric layer, such that after forming the junction, forming the first gate dielectric layer, and forming the first conductive member, the first gate dielectric lies between the first conductive member and the junction; and
forming a second gate dielectric layer before forming the second conductive member.

* * * * *